United States Patent
Brox et al.

(10) Patent No.: US 7,411,439 B2
(45) Date of Patent: Aug. 12, 2008

(54) DRIVER CIRCUIT WITH REDUCED JITTER BETWEEN CIRCUIT DOMAINS

(75) Inventors: Martin Brox, Munich (DE); Maksim Kuzmenka, Munich (DE)

(73) Assignee: Infineon Technologies AG, Munich (DE)

( * ) Notice: Subject to any disclaimer, the term of this patent is extended or adjusted under 35 U.S.C. 154(b) by 69 days.

(21) Appl. No.: 11/260,506

(22) Filed: Oct. 27, 2005

(65) Prior Publication Data
US 2006/0103446 A1 May 18, 2006

(30) Foreign Application Priority Data
Nov. 11, 2004 (DE) ........................ 10 2004 054 546

(51) Int. Cl.
*H03L 5/00* (2006.01)
(52) U.S. Cl. ........................................ 327/333; 326/62
(58) Field of Classification Search ............... 326/62, 326/63, 68, 80, 81; 327/333; 365/189.11
See application file for complete search history.

(56) References Cited

U.S. PATENT DOCUMENTS

| | | | | |
|---|---|---|---|---|
| 4,890,016 | A * | 12/1989 | Tanaka et al. | 326/27 |
| 5,149,990 | A * | 9/1992 | Yamazaki et al. | 326/21 |
| 5,926,050 | A * | 7/1999 | Proebsting | 327/170 |
| 5,990,706 | A * | 11/1999 | Matsumoto et al. | 326/98 |
| 6,025,738 | A * | 2/2000 | Masleid | 326/83 |
| 6,154,045 | A * | 11/2000 | Ye et al. | 326/17 |
| 6,424,173 | B1 * | 7/2002 | Vannorsdel | 326/68 |
| 6,515,532 | B2 * | 2/2003 | Jinzai | 327/333 |
| 6,630,851 | B2 * | 10/2003 | Masleid | 327/165 |

(Continued)

FOREIGN PATENT DOCUMENTS

DE    10 2004 036 892 A1    2/2005

(Continued)

OTHER PUBLICATIONS

Lee, J.B., et al., "Digitally-Controlled DLL and I/O Circuits for 500 Mb/s/pin x16 DDR SDRAM,"ISSCC 2001/Session 4/High-Speed Digital Interfaces/4.6, 2001 IEEE International Solid State Circuits Conference, 3 pages.

(Continued)

*Primary Examiner*—N. Drew Richards
*Assistant Examiner*—William Hernandez
(74) *Attorney, Agent, or Firm*—Slater & Matsil, L.L.P.

(57) ABSTRACT

A circuit for coupling a logic signal from a circuit input to a circuit output includes a parallel connection of a first circuit branch and a second circuit branch, wherein an inverter in the first branch powered as last inverter in this branch via first supply terminals, via which a first supply potential and a second supply potential are supplied, and an inverter in the second branch powered as first inverter in this branch via second supply voltage terminals, via which a second supply potential and a second reference potential are supplied, are adapted to receive the same logic value of the logic signal, wherein outputs of the two circuit branches are connected to each other and coupled to the circuit output. In such a circuit, propagation time differences of rising and falling edges, which may develop by fluctuation of various supply potentials, may be minimized. Thus, a transition from an internal supply potential to an external supply potential may take place, without noticeably degrading the signal timing.

19 Claims, 6 Drawing Sheets

U.S. PATENT DOCUMENTS

| | | | |
|---|---|---|---|
| 6,784,719 B2* | 8/2004 | Okamoto et al. | 327/333 |
| 7,190,206 B2* | 3/2007 | Lee et al. | 327/333 |
| 7,251,740 B2* | 7/2007 | Newman | 713/401 |
| 7,292,217 B2* | 11/2007 | Tseng et al. | 345/100 |
| 2001/0017783 A1 | 8/2001 | Bruckmann et al. | |
| 2002/0039042 A1* | 4/2002 | Jinzai | 327/333 |
| 2003/0137336 A1* | 7/2003 | Okamoto et al. | 327/333 |
| 2005/0017783 A1* | 1/2005 | Lee et al. | 327/333 |

FOREIGN PATENT DOCUMENTS

EP  1 326 342 A1  7/2003

OTHER PUBLICATIONS

Kanno, Y., et al., "Level Converters with High Immunity to Power-Supply Bouncing for High-Speed Sub-1-V LSIs," 2000 IEEE Symposium on VLSI Circuits Digest of Technical Papers, pp. 202-203.

* cited by examiner

DRIVER CIRCUIT WITH REDUCED JITTER BETWEEN CIRCUIT DOMAINS

This application claims priority from German Patent Application No. 10 2004 054 546.4, which was filed on Nov. 11, 2004, and is incorporated herein by reference in its entirety.

TECHNICAL FIELD

The present invention generally relates to a driver circuit, particularly an output driver (off-chip driver) with reduced propagation time difference at the transition between circuit domains with different operating voltages (domain transition skew).

BACKGROUND

In modern high-speed logic circuits, the requirements for meeting default timings at the inputs and outputs are very strict. Hence, the corresponding input and output drivers are very important today. In order to illustrate the problems occurring in the operation of an output driver, an exemplary output circuit according to the prior art will be described in greater detail in the following.

FIG. 6 shows a simplified circuit diagram of an output driver of a microelectronic circuit according to the prior art in connection with an excitation source. The overall circuit arrangement is designated with 610. It includes an excitation source 620 as well as a driver circuit 622. The excitation source 620 includes a first inverter 630 the data input D of which is controlled by a pseudo random data signal (PRBS) source 632. The pseudo random data generator 632 provides pseudo random data at a bit rate of 1.6 Gbps. The first inverter 630 is coupled to a first supply potential VDD and a first reference potential VSS, wherein the potential difference between the first supply potential VDD and the first reference potential VSS is 1.8 volt in the example shown. This voltage supply is impressed from outside and is symbolically shown by a direct voltage source 634. Furthermore, it is to be noted that the first reference potential VSS is connected to a global reference potential GND. Furthermore, it is to be noted that the n-channel MOS field effect transistor of the first inverter 630 has a channel width of 2 µm, whereas the p-channel MOS field effect transistor of the first inverter 630 has a channel width of 4.5 µm. The inverters of the shown circuit are conventional CMOS inverters, as shown in the legend 640. In order to achieve equal rise and fall times, the accompanying p-channel MOS field effect transistors and n-channel MOS field effect transistors have different channel widths, which are correspondingly labeled in FIG. 6.

The driver circuit 622 includes two series-connected inverters 650, 652 coupled to a second supply potential VDDQ and a second reference potential VSSQ. The input of the second inverter 650 is coupled to the output of the first inverter 630 of the excitation source 620. The output of the second inverter provides a control signal DX for the third inverter 652. The output of the third inverter 652 is coupled to the circuit output 656. The potential difference between the second supply potential VDDQ and the second reference potential VSSQ is a constant 1.8 volts, which is characterized by the direct voltage source 660. The second reference potential VSSQ is not identical with the global reference potential GND, but is coupled thereto via a noise voltage source 670 in the given modeling. In the given modeling, the noise voltage source provides a sinusoidal voltage signal with an amplitude of 0.35 volts and a frequency of 1 gigahertz. In the given circuit, the output voltage 680 is defined or tapped between the second reference potential VSSQ and the circuit output 656.

Based on the structural description, the functioning of a conventional output driver circuit 610 will be described in the following. It is the object of the circuit shown to make an internal signal, present at the data input D, available at an external bus attached at the circuit output 656 in well-defined manner in buffered form. The signal at the data input D has transitions between the potentials VDD (logically HIGH) and VSS (logically LOW). The output buffer formed by the driver circuit 622 is supplied via separate potential supplies (power rails) providing the second supply potential VDDQ as well as the second reference potential VSSQ. The separation between internal supply potentials including the first supply potential VDD as well as the first reference potential VSS and external supply potentials including the second supply potential VDDQ as well as the second reference potential VSSQ is necessary because the external supply potentials, i.e. VDDQ and VSSQ, are subject to irregular fluctuations caused by inductances, when the buffer drives the external bus. In a typical operation of a device or an integrated circuit, it is helpful to decouple these statistical fluctuations from the on-chip potential rails guiding the first supply potential VDD and the first reference potential VSS. In the following, it is assumed that in a static case the first supply potential VDD is equal to the second supply potential VDDQ, and that the first reference potential VSS is equal to the second reference potential VSSQ (VDDQ=VDD; VSSQ=VSS).

In order to be able to meet strict specifications with reference to the output-side timings, it is important to ensure that the propagation time delay by the buffer is constant at all events. For example, if a rising edge propagates more quickly through the buffer than a falling edge, the output-side timings between the rising and falling edges would be temporally shifted relative to each other.

Furthermore, fluctuating or noisy voltages significantly contribute to shifts in the timings. Although a capacitive coupling between the first supply potential VDD and the first reference potential VSS as well as between the second supply potential VDDQ and the second reference potential VSSQ, which exists on a chip, may ensure that the potential differences between the first supply potential VDD and the first reference potential VSS as well as between the second supply potential VDDQ and the second reference potential VSSQ are constant, but the relations between the first supply potential VDD and the second reference potential VSSQ (VDD-VSSQ) as well as between the second supply potential VDDQ and the first reference potential VSS (VDDQ-VSS) are not well-controlled at the presence of statistical disturbances on the second supply potential VDDQ and the second reference potential VSSQ induced by inductances. Hence, each transistor working at the boundary between circuit domains supplied with the first supply potential VDD and the first reference potential VSS and circuit domains supplied with the second supply potential VDDQ and the second reference potential VSSQ contributes a signal propagation time sensitive to statistical fluctuations of the supply and reference potentials.

The example according to the prior art shown on the basis of FIG. 6 is a starting basis for a simulation with the Agilent Technologies simulation software ADS. In this simulation, statistical fluctuations (noise) caused by inductances on the second supply potential VDDQ and the second reference potential VSSQ are modeled by a voltage source providing a sinusoidal voltage with an amplitude of 0.35 volts and a frequency of one gigahertz. The pseudo random data generator 632 providing a data stream at a bit rate of 1.6 gigabits per second (1.6 Gbps) here serves as excitation for the simulated circuit arrangement 610. Here, the output voltage 680 between the circuit output 656 and the second reference potential VSSQ is observed.

FIG. 7 shows an extract from a simulated eye diagram for an output driver according to the prior art. The eye diagram in its entirety is designated with 710. Here, the data eye for the output voltage 680 is shown at a transition from a low logic level to a high logic level and vice versa. The abscissa 720 shows the time in ps, wherein a period of time from 0 to 625 ps is shown here. The ordinate 722 shows the output voltage 680 and is scaled in volts.

In the previously described circuit modeling, the eye diagram 710 shows a jitter 730 of 75 ps on the output voltage 680. This jitter 730 is caused by the transition from a circuit domain supplied with the first supply potential VDD to a circuit domain supplied with the second supply potential VDDQ (VDD-VDDQ domain transition).

For better understanding it is here also gone into some details of the circuit function. On the one hand, it is important to view the differences between the two voltage supplies. An integrated circuit arrangement modulated by the excitation source 620 in the circuit arrangement 610 shown on the basis of FIG. 6 is operated at a power supply that is only subject to small fluctuations (low noise power supply). The potential difference between the accompanying first supply potential VDD and the first reference potential VSS is approximately constant. In practice, this is ensured by capacities existing on a chip between the corresponding supply lines or supply layers. The first supply potential VDD and the first reference potential VSS are largely fixed also with reference to a global reference potential GND and only subject to small fluctuations. On the other hand, the second supply potential VDDQ as well as the second reference potential VSSQ represent a fluctuating power supply (noisy power supply). The potential difference between the second supply potential VDDQ and the second reference potential VSSQ is here again approximately constant by capacities, but the two potentials fluctuate with reference to a global reference potential GND.

Furthermore, in the following, it is gone into how a switching operation at the transition between the circuit domain supplied with the first supply potential VDD and the circuit domain supplied with the second supply potential VDDQ takes place. What is viewed here is the handover of a signal from the first inverter 630 to the second inverter 650. The first inverter 650 here includes a pMOS field effect transistor, the source terminal of which is connected to the second supply potential VDDQ, as well as an nMOS field effect transistor, the source terminal of which is connected to the second reference potential VSSQ. Here, a discharge operation, in which a capacity at the input of the third inverter 652 is discharged, and a charge operation, in which a capacity at the input of the third inverter 652 is charged, is considered. Charge operation and discharge operation represent the two state transitions possible and determine the steepness and temporal location of the switching edges.

A discharge operation is initiated by the output of the first inverter supplied by the first supply potential VDD taking on a logically HIGH level. The output of the first inverter thus is at or close to the first supply potential VDD. This potential is also present at the gate terminals of the MOS field effect transistors of the second inverter 650. Here, the nMOS field effect transistor of the second inverter 650, the source terminal of which is at the second reference potential VSSQ, is relevant for the discharge operation. The potential difference between the first supply potential VDD and the second reference potential VSSQ is decisive for the current flow through the nMOS field effect transistor, which discharges a capacity of the third inverter 652.

Similarly, a charge operation is initiated by the output of the first inverter 630 assuming a logically LOW state. This means that the output of the first inverter 630 is at the first reference potential VSS or very close thereto. The pMOS field effect transistor of the second inverter 650 is responsible for the charge operation of a capacity at the input of the third inverter 652. The first reference potential VSS is present at its gate, whereas the second supply potential VDDQ is present at a source terminal. The potential difference between the second supply potential VDDQ and the first reference potential VSS here is responsible for the charge current.

Shifts between the first supply potential VDD and the second supply potential VDDQ or between the accompanying first reference potential VSS and the accompanying second reference potential VSSQ lead to the fact that the charge and discharge currents, respectively, are changed with reference to a desired nominal state. Depending on the potential difference between the first and second potentials, thus a temporal shift of edges develops at a switching transition. It is especially disturbing here that the edges shift differently for rising and falling switching transitions. Thereby predetermined timings are disturbed.

According to the prior art, a series of solutions are known, which are supposed to guarantee constant signal propagation time at a transition between circuit domains with different supply voltages. Since the basic reason for the propagation time changes induced by statistical potential fluctuations is the statistical potential variations on a chip induced by inductances, simple solutions aim at directly minimizing the statistical potential fluctuations (noise). This may be achieved in simple manner by a decrease in the overall inductance on the potential supplies for the second supply potential VDDQ and the second reference potential VSSQ (VDDQ/VSSQ power rails). A decrease in the overall inductance is possible either by an increase of the number of connections for the second supply potential VDDQ and the second reference potential VSSQ or by the use of a better package. In the first solution, several inductances are connected in parallel, whereby the overall inductance decreases, in the latter solution the inductance per connection is lower. Both solutions, however, are of limited practical use, since they result in a more expensive product.

A further solution for the improvement of the time domain properties is described in the conference contribution "Digitally-Controlled DLL and I/O Circuits for 500 Mb/s/pin×16 DDR SDRAM", ISSCC 2001, pages 68 f., by J. B. Lee et al. In this article it is proposed to displace the boundary between the circuit domains supplied with a first supply potential and the circuit domains supplied with a second supply potential (domain transition) from the input of the last driver stage to the input of the pre-driver. This solution reduces the magnitude of the introduced propagation time differences but is not capable of eliminating them completely, because voltage differences subject to statistical fluctuations continue existing at the input of the pre-driver. The improvements achievable by such a circuit arrangement are already to be seen in FIG. 7, because the transition between circuit domains with different supply potentials (domain transition) is not situated at the input of the last driver stage but already at the input of the pre-driver in the simulated circuit arrangement 610 according to FIG. 6.

A further solution for the decrease of temporal insecurities may for example be derived from the conference contribution "Level Converters with High Immunity to Power-Supply Bouncing for High-Speed sub-1-V LSIs", Symposium VLSI Circuits 2000, pages 202 f., by Y. Kanno et al. This article teaches the use of a level converter to provide a transition from a circuit domain supplied with a first supply potential to a second circuit domain supplied by a second supply potential. Level converters have to be used if the first supply potential VDD is more negative than the second supply potential VDDQ (VDD<VDDQ). If in a static operating state, however, the first supply potential VDD is equal to the second supply potential VDDQ (VDD=VDDQ), and the first reference potential VSS is also equal to the second reference potential VSSQ (VSS=VSSQ), the realization of a level converter is typically avoided, because level converters introduce an additional time delay in the output path and are only difficult to design without propagation time differences.

SUMMARY OF THE INVENTION

It is an object of the present invention to provide a driver circuit enabling a transition between circuit domains with various supply and reference potentials and insensitive to shifts between the input-side and output-side potentials with reference to the temporal location of switching edges. Furthermore, it is an object of the present invention to provide a method for transmitting a signal between circuit domains with various supply and reference potentials, which is insensitive to supply potential fluctuations.

In accordance with a first aspect, the present invention provides a circuit for coupling a logic signal from a circuit input to a signal output, having: a parallel connection of a first circuit branch and a second circuit branch, wherein an inverter in the first circuit branch powered as last inverter in this branch via first supply terminals, via which a first supply potential and a first reference potential are supplied, and an inverter in the second circuit branch powered as first inverter in this circuit branch via second supply voltage terminals, via which a second supply potential and a second reference potential are supplied, are adapted to receive the same logic value of the logic signal, wherein outputs of the two circuit branches are connected to each other and coupled to the circuit output, wherein the circuit is arranged on a chip, the chip having on-chip potential rails for guiding the first supply potential and the first reference potential, wherein there also are potential feeds for providing the second supply potential and the second reference potential on the chip, and wherein the on-chip potential rails are separated from the potential feeds for providing the second supply potential and the second reference potential.

In accordance with a second aspect, the present invention provides a method for transmitting an input signal from a first circuit domain of a circuit coupled to a first supply potential and a first reference potential to a second circuit domain of the circuit coupled to a second supply potential and a second reference potential, wherein the circuit is arranged on a chip, the chip having on-chip potential rails for guiding the first supply potential and the first reference potential, wherein there also are potential feeds for providing the second supply potential and the second reference potential on the chip, and wherein the on-chip potential rails are separated from the potential feeds for providing the second supply potential and the second reference potential, with the steps of: splitting up the input signal into a first signal passed on via a first circuit branch and a second signal passed on via a second circuit branch; handing over a signal dependent on the input signal from the first circuit domain to the second circuit domain in the first circuit branch; handing over a signal dependent on the input signal from the first circuit domain to the second circuit domain in the second circuit branch, wherein the signal handed over from the first circuit domain to the second circuit domain in the second circuit branch has a logic level complementary to a logic level of the signal handed over from the first circuit domain to the second circuit domain in the first circuit branch; and recombining the signals passed on via the two circuit branches, in order to obtain an output signal, wherein a temporal location of level transitions on the output signal is determined by averaging temporal locations of accompanying level transitions on the signals passed on via the two circuit branches.

The present invention provides a circuit for coupling a logic signal from a circuit input to a circuit output with a parallel connection of a first circuit branch and a second circuit branch, wherein an inverter in the first branch powered, as last inverter in this branch, via first supply potential terminals coupled to a first supply potential and a first reference potential and an inverter in the second branch powered, as first inverter in this branch, via second supply potential terminals coupled to a second supply potential and a second reference potential are adapted to receive the same logic value of a logic signal, and wherein outputs of the two circuit branches are connected to each other and coupled to the circuit output.

Apart from this, the present invention provides a method for transmitting an input signal from a first circuit domain coupled to a first supply potential and a first reference potential to a second circuit domain coupled to a second supply potential and a second reference potential.

It is the central idea of the present invention that it is advantageous to use two circuit branches for time-stable transmission of a signal from a first circuit domain to a second circuit domain coupled to other supply potentials than the first circuit domain, wherein, in the first circuit branch, a first signal based on the input signal is handed over from the first circuit domain to the second circuit domain, and in the second circuit branch a second signal with a logic value complementary to the first signal is handed over, wherein the outputs of the two circuit branches are connected to each other and coupled to the circuit output. In such a circuit design, two signals with mutually complementary logic values are transmitted from the first circuit domain coupled to a first supply potential and a first reference potential to the second circuit domain coupled to a second supply potential and a second reference potential. If the value of the input signal changes, opposing edges occur in both signals. Depending on how the input-side supply and reference potentials are related to the output-side supply and reference potentials, rising and falling edges with a different delay are recognized by the second circuit domain. By a combination of the output signals of the two circuit branches, however, averaging may take place so that the time instant of a transition at the circuit output lies between the time instants at which a rising and a falling edge are recognized in the second circuit domain. Since the signal propagation times for a rising and a falling edge change in about opposite manner depending on a potential difference between the supply and reference potentials of the first and second circuit domains, averaging between the two time instants at which a rising edge and a falling edge are recognized in the second circuit domain leads to an overall signal propagation time by the circuit for coupling a logic signal, which only has little dependence on the potential difference between the supply and reference potential of the first and second circuit domains.

The advantage of an inventive circuit lies in the fact that it reacts in a more insensitive way to statistical fluctuations between the input-side and the output-side supply and reference potentials than conventional circuits. According to an exemplary simulation, the jitter in an inventive circuit may be reduced to 20 ps, whereas a jitter of about 75 ps occurs in a conventional circuit arrangement. The circuit overhead necessary for achieving such an improvement is extremely small. Furthermore, in contrast to some conventional circuits, it is possible to use the same supply voltage, and thus equal signal amplitudes, on the input side and on the output side.

In a preferred embodiment, the inventive circuit is connected between a first circuit arrangement and a second circuit arrangement, wherein the first circuit arrangement is coupled to the first supply potential and the first reference potential, and wherein the second circuit arrangement is coupled to the second supply potential and the second reference potential. With this, the inventive circuit is suited to transmit a signal independently of the supply and reference potentials of the first and second circuitries attached at the circuit input and the circuit output, i.e. without corrupting the timings of supply potential fluctuations.

The inventive circuit may preferably be employed in connection with an integrated circuit arrangement, wherein the circuit input or the circuit output of the inventive circuit is coupled to the integrated circuit arrangement, and wherein the input or output-side supply and reference potentials of the inventive circuit are equal to the supply and reference potentials of the integrated circuit. By monolithic integration of the inventive circuit and an integrated circuit arrangement, it is ensured here that no potential fluctuations occur between the inventive circuit and the integrated circuit arrangement.

Furthermore, it is preferred that the outputs of both circuit branches of the inventive circuit are connected to each other and coupled to the circuit output via an output driver. The output driver is preferably coupled to the second supply potential and the second reference potential. In such a design, the output signals of the two circuit branches are advantageously buffered by an output driver, wherein a temporal shift of edges between the outputs of the two circuit branches and the output driver is avoided by the use of equal supply and reference potentials by the output-side stages of the two circuit branches as well as by the output driver.

Furthermore, it is preferred to supply the inputs of the two circuit branches with a signal based on the input signal. In an especially simple embodiment of the inventive circuit, the inputs of the two circuit branches are directly supplied with the input signal. Both circuit branches thus have the same input signal, whereby elimination or averaging out of temporal shifts in the transmission by the two circuit branches may take place in especially advantageous manner.

Furthermore, it is preferred that signals with equal logic value are present at the outputs of the two circuit branches in a stationary state of operation. If equal logic values, i.e. either a high voltage level or a low voltage level, are present at the two circuit branches, the outputs of the two circuit branches may be combined particularly advantageously, without high current flowing in a stationary operation. With this, such a circuit design may be operated approximately powerless in a stationary operation. Furthermore, a particularly advantageous reduction or compensation of temporal shifts in both circuit branches is possible, since an averaging interconnection of the outputs of the two circuit branches may achieve this object.

It is furthermore preferred that the first and second circuit branches each consist of a series connection of transmission stages. It is preferred that a number of input-side transmission stages are coupled to the first supply potential and the first reference potential, whereas the remaining, output-side, transmission stages are coupled to the second supply potential and the second reference potential. In such a design, there is, in the first and second circuit branches each, a unique separation between circuit domains coupled to the first supply and reference potentials and circuit domains coupled to the second supply and reference potentials.

According to the invention, the signals in the first and second circuit branches have opposite logic values at the respective boundary location between circuit domains with different supply and reference potentials. Thus, opposite edges are transmitted across the two boundary locations in the first and second circuit branches at a switching transition, wherein, depending on the potential difference between the input and output-side supply and reference potentials, the one edge is passed on in delayed manner and the other edge in accelerated manner. In an inventive circuit design, this delay or acceleration is balanced by averaging.

It is preferred for the first and second circuit branches to have an equal number of stages, since then it may be assumed that the two circuit branches have equal signal propagation times. The boundary locations in the first and second circuit branches are preferably shifted by an inverting transmission stage. Thereby, it is achieved that opposing signal levels or edges each are transmitted across the previously described boundaries or boundary locations. Inverters and non-inverting drivers are preferred as transmission stages.

Furthermore, it is convenient that the number of inverters in the first and second circuit branches is equal. With this, the first and second circuit branches have the same transmission characteristic (inverting or non-inverting) in stationary view. Thus, it is easily possible to connect the two circuit branches in parallel, without further input or output-side coupling measures being necessary.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

Figure 1:
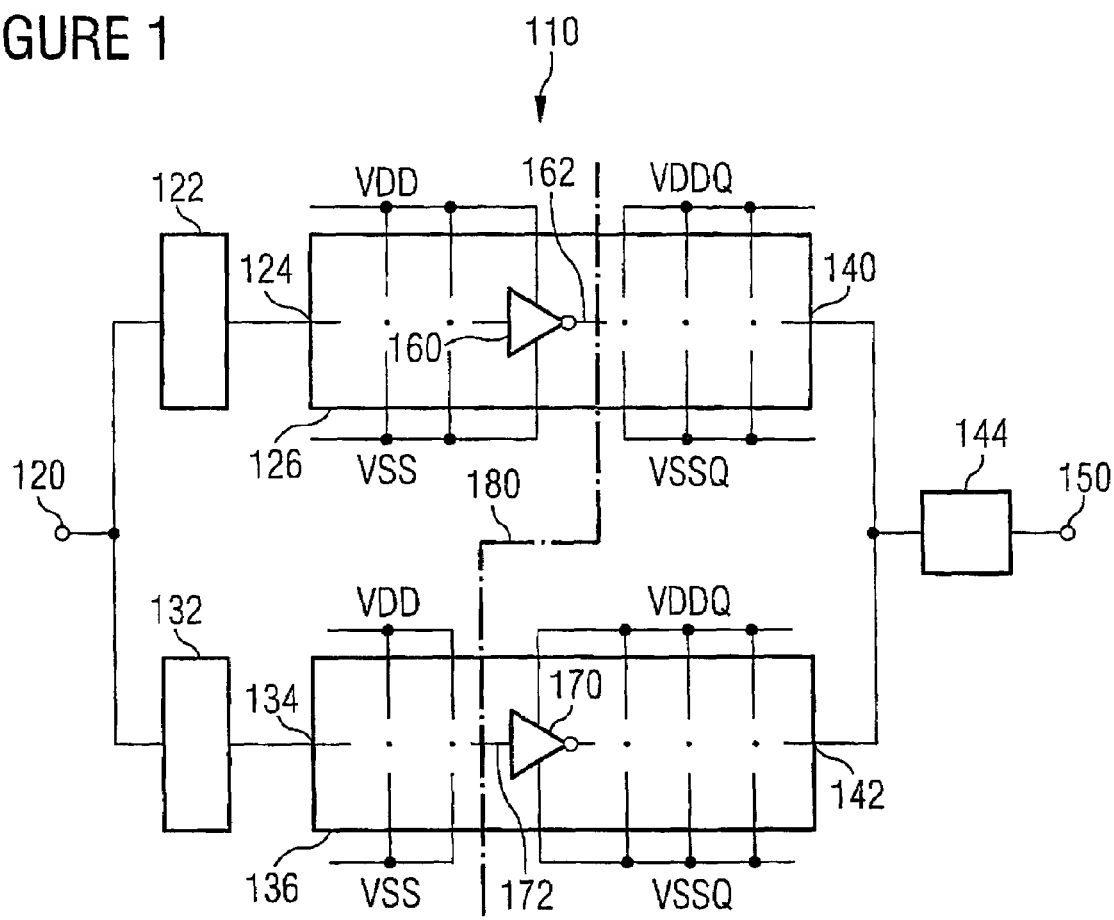
FIG. 1 is a block circuit diagram of an inventive circuit according to a first embodiment of the present invention.

FIG. 1 shows a block circuit diagram of an inventive circuit according to a first embodiment of the present invention. The circuit in its entirety is designated with 110. The circuit 110 comprises a circuit input 120 coupled to an input 124 of a first circuit branch 126 via a first coupling network 122. Furthermore, the circuit input 120 is connected to an input 134 of a second circuit branch 136 via a second coupling means 132. The outputs 140, 142 of the first circuit branch 126 and of the second circuit branch 136 are connected to each other and coupled to a circuit output 150 via an output-side coupling network 144. The first and second circuit branches are substantially constructed in parallel manner. The first circuit branch 126 comprises at least an input-side inverter 160 coupled to a first supply potential VDD as well as a first reference potential VSS. Between the input 124 of the first circuit branch and the input-side inverter 160, there could optionally be still further transmission stages coupled to the first supply potential VDD and the first reference potential VSS. Downstream of the input-side inverter 160 in the first circuit branch 126, there may still be one or more transmission stages coupled to the second supply potential VDDQ as well as the second reference potential VSSQ. The input-side inverter 160, however, is the last signal transmission stage coupled to the first supply potential VDD and the first reference potential VSS when viewing a signal flow between the input 124 of the first signal branch and the output 140 of the first signal branch.

The second signal branch 136 similarly includes an output-side inverter 170 coupled to the second supply potential VDDQ and the second reference potential VSSQ. Between the output of the output-side inverter 170 and the output 142 of the second circuit branch, further stages coupled to the second supply potential VDDQ and the second reference potential VSSQ may be connected. Still further transmission stages coupled to the first supply potential VDD and the first reference potential VSS may also be connected between the input 134 of the second circuit branch and the input of the output-side inverter 170. But the output-side inverter 170 is the first inverter coupled to the second supply potential VDDQ and the second reference potential VSSQ in signal flow direction from the input 134 to the output 132 of the second circuit branch.

Based on the structural description, the functioning of an inventive circuit 110 will be described in the following. According to the invention, the circuit 110 is adapted so that the inputs of the input-side inverter 160 as well as the output-side inverter 170 receive signals having the same logic value. Thus, the logic value at the output 162 of the input-side inverter 160 is opposite to the signal at the input 172 of the output-side inverter 170. The signals at the output 162 of the input-side inverter 160 in the first circuit branch 162 and at the input 172 of the output-side inverter 170 in the second circuit branch 136, however, are exactly the signals transmitted across a boundary 180 separating circuit domains coupled to the first supply potential VDD and the first reference potential VSS or to the second supply potential VDDQ and the second reference potential VSSQ. With this, two signals having opposite logic values are transmitted across the boundary 180. Correspondingly, opposing edges occur at the boundary 180 at a switching transition at the circuit input 120. If the first and second potentials VDD, VSS; VDDQ, VSSQ are shifted against each other, a rising edge transmitted across the boundary 180 is delayed, and a falling edge transmitted across the boundary 180 is accelerated, or vice versa. But the shown circuit design with two parallel circuit branches enables, by the connection of the outputs 140, 142 of the first and second circuit branches 126, 136, to achieve averaging between the time instants at which switching edges belonging to a change of the signal at the circuit input 120 occur. Thereby, a shift of switching edges developing by fluctuations of the output-side supply and reference potentials VDDQ, VSSQ is decreased or eliminated by averaging.

Figure 2:
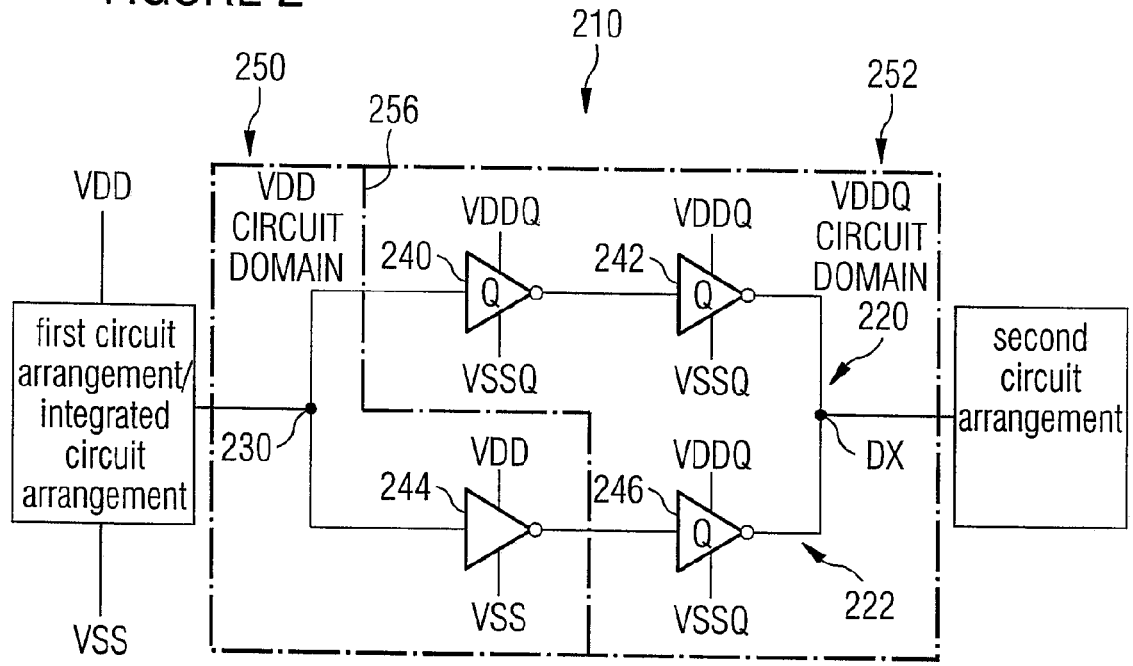
FIG. 2 is a circuit diagram of an inventive circuit with four inverters according to a second embodiment of the present invention.

FIG. 2 shows a circuit diagram of an inventive circuit with four inverters according to a second embodiment of the present invention. The circuit in its entirety is designated with 210. The circuit comprises two signal paths 220, 222 switched in parallel between an input node 230 and an output node DX. The second circuit branch includes a third inverter 240, the input of which is coupled to the input node 230, and is coupled to the second supply potential VDDQ and the second reference potential VSSQ. Downstream to this, there is a fourth inverter 242, the input of which is coupled to the output of the third inverter 240 and the output of which is connected to the output node DX. The fourth inverter 242 is coupled to the second supply potential VDDQ and the second reference potential VSSQ. The first circuit branch 222 also includes two inverters. The input of the first inverter 244 is coupled to the input node 230. Furthermore, the first inverter is coupled to the first supply potential VDD and the first reference potential VSS for energization. Downstream of the first inverter, there is a second inverter 246, the input of which is connected to the output of the first inverter 244. The second inverter 246 is coupled to the second supply potential VDDQ and the second reference potential VSSQ, and its output is connected to the output node DX.

Thus, it is to be noted that only the first inverter 244 is coupled to the first supply potential VDD and the first reference potential VSS , whereas the third, fourth, and second inverters 240, 242, 246 are coupled to the second supply potential VDDQ and the second reference potential VSSQ. Furthermore, it is to be noted that it is assumed that a control circuit coupled to the input node 230 is also coupled to the first supply potential VDD and the first reference potential VSS. Furthermore, it is assumed that an output driver coupled to the output node DX is operated at the second supply potential VDDQ and the second reference potential VSSQ. Thus, two circuit domains 150, 152 may be distinguished, wherein the elements of the first, input-side, circuit domain 150 are coupled to the first supply potential VDD and the first reference potential VSS, and wherein the elements of the second, output-side, circuit domain 152 are coupled to the second supply potential VDDQ and the second reference potential VSSQ. A boundary 156 may be defined between the two circuit domains 150, 152. Besides, it is noted that the first circuit domain 150 is also referred to as "VDD domain" and the second circuit domain 152 as "VDDQ domain". An input signal at the input node 230 refers to the first supply potential VDD and the first reference potential VSS (VDD domain), whereas an output signal at the output node DX refers to the second supply potential VDDQ and the second reference potential VSSQ (VDDQ domain).

Based on the structural description of the circuit 210, the functioning will be explained in greater detail in the following. Here, the inventive principle will be described in detail.

In the design of an inventive circuit arrangement it is started out from the observation that an on-chip capacity ensures that the voltage of the individual supply branches is constant, i.e. that the potential difference between the first supply potential VDD and the first reference potential VSS is constant, and that the potential difference between the second supply potential VDDQ and the second reference potential VSSQ is constant. Expressed in formulae, (VDD-VSS)=constant, (VDDQ-VSSQ)=constant applies.

Assuming that the first circuit domain and the second circuit domain work with a supply voltage equal in magnitude, (VDD-VSS)=(VDDQ-VSSQ)

applies.

In the following, the conditions at the transition between the first circuit domain 250 coupled to the first supply potential VDD and the first reference potential VSS and the second circuit domain 252 coupled to the second supply potential VDDQ and the second reference potential VSSQ are examined. Here, it is assumed that the first transmission stages in the second circuit domain 252 are inverters 240, 246, with an n-channel field effect transistor and a p-channel field effect transistor, wherein the source terminal of the n-channel field effect transistor is coupled to the second reference potential VSSQ, and wherein the source terminal of the p-channel field effect transistor is coupled to the second supply potential VDDQ.

In the following, the first circuit branch 222 will exemplarily be considered, but the considerations are also transferable to the second circuit branch 220. For a rising edge at the boundary 256 between the first circuit domain 250 and the second circuit domain 252, the n-channel field effect transistor of the first inverter in the second circuit domain 252, i.e. here the second inverter 246, has to discharge its output node DX. If the input of the inverter 246 is controlled quickly enough, the transition of the input signal may be neglected. Under this condition, the gate terminal of the n-channel field effect transistor is at the first supply potential VDD, whereas its source terminal is at the second reference potential VSSQ. At the beginning of the switching operation, the n-channel field effect transistor is in a saturation operation range, and, in good approximation, the discharge current for the output node DX is exclusively a function of the gate-source voltage:

$I\_discharge=I(VDD-VSSQ)$.

On the other hand, the p-channel field effect transistor of the inverter 246 has to charge its output node DX at a transition between the first circuit domain 250 and the second circuit domain 252 at a falling input edge. For the accompanying charge current, $I\_charge=I(VDDQ-VSS)$ applies.

Here, it is assumed that the first reference potential and the second reference potential as well as the first supply potential VDD and the second supply potential VDDQ may differ by a potential difference $\Delta V$, wherein:

$VSSQ=VSS+\Delta V$ and $VDDQ=VDD+\Delta V$ applies.

If the second reference potential VSSQ for example increases by $\Delta V$ in positive direction, the second supply potential follows this increase, as fixed by the assumption VDDQ-VSSQ=constant.

Hence, for the discharge current, one may write:

$I\_discharge=I(VDD-VSS-\Delta V)$.

For the corresponding charge current at a negative edge at the input of the inverter 246, $I\_charge=I(VDD-VSS+\Delta V)$ applies.

Thus, it can be noted that, for a positive fluctuation of the second reference potential VSSQ with reference to the first reference potential VSS, a rising edge is transmitted in decelerated manner by the inverter 256 to its output due to a decreased discharge current I_discharge at the transition between the first and second circuit domains 250, 252, and that a falling edge is transmitted in accelerated manner due to an increased charge current I_charge at the transition between the first circuit domain 250 and the second circuit domain 252. According to a linear approximation, however, it is expected that the average delay is constant:

$(I\_discharge+I\_charge)=constant$.

Hence, by combination of the propagation of a rising and a falling edge at the boundary 256 between circuit domains 250, 252 coupled to various supply and reference potentials VDD, VDDQ, VSS, VSSQ, signal propagation in which propagation time differences caused by potential fluctuations are decreased or suppressed may be achieved.

A simple circuit realizing this central idea is shown in FIG. 2. The input signal at the input node 230 is transmitted via two signal paths passing in a second circuit branch 220 and a first circuit branch 222. Each signal path consists of two inverters 240, 242; 244, 246. The output-side stages formed by the fourth inverter 242 and the second inverter 246 are both coupled to the second supply potential VDDQ and the second reference potential VSSQ. The output-side stages 242, 246 both drive the common output node DX. The boundary 256 between the first circuit domain 250 and the second circuit domain 252 runs between the input node 230 and the input of the third inverter 240 as well as between the first inverter 244 and the second inverter 246. Thus, there are two transitions between the supply potential domains, at which mutually complementary signals or edges are present. Thus, on the one hand, a signal the logic value of which is equal to the input signal and also a signal the logic value of which is complementary to the logic value of the input signal are transmitted across the boundary 256 between the two circuit domains 250, 252. At each switching transition, both a rising and a falling edge are transmitted from the first circuit domain 250 to the second circuit domain 252. Correspondingly, averaging of the edge position may take place. The combination of the outputs of the two circuit branches 220, 222 ensures that the signal at the output node DX as opposed to the signal at the input node 230 has a signal propagation time corresponding to about the mean value of the signal propagation times in the two circuit branches 220, 222.

In summary, it may be established that, instead of usually one transition between circuit domains coupled to different supply and reference potentials (domain transition), two such transitions are used according to the invention. The resulting signal is generated by mixing or combination or superimposition of the two signal paths.

If the second supply potential VDDQ and the second reference potential VSSQ shift upward with reference to the first potentials, the third inverter 240 slows down for a rising edge, because its n-channel field effect transistor works between the first supply potential VDD and the second reference potential VSSQ, whereas the second inverter 246 becomes quicker, because its p-channel field effect transistor works between the second supply potential VDDQ and the first reference potential VSS. The speed of an averaged signal path is thus independent of shifts of the supply and reference potentials.

Figure 3:
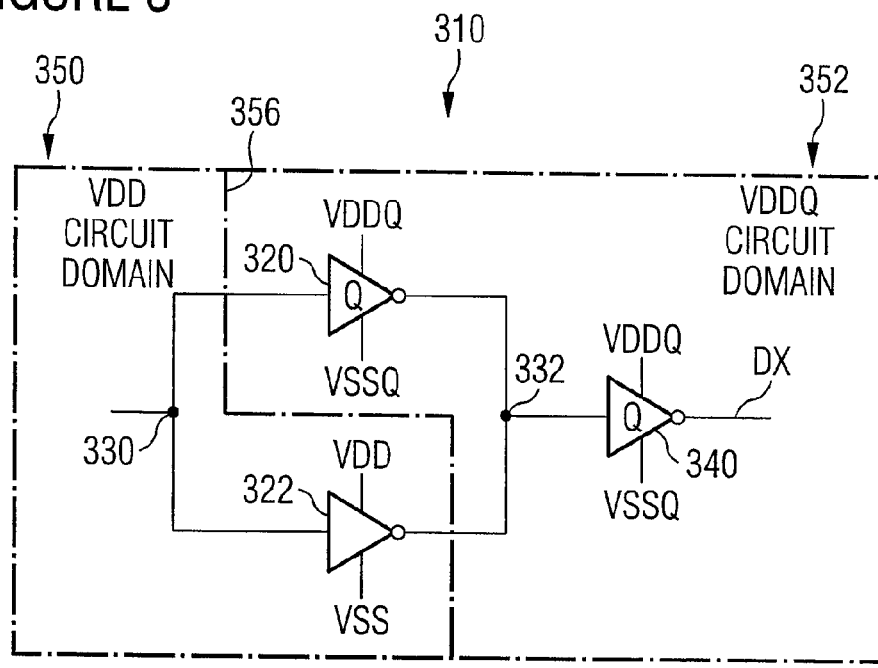
FIG. 3 is a circuit diagram of an inventive circuit with three inverters according to a third embodiment of the present invention.

FIG. 3 shows a circuit diagram of an inventive circuit with three inverters according to a third embodiment of the present invention. The circuit in its entirety is designated with 310. The circuit includes a first inverter 322 as well as a second inverter 320, connected in parallel between an input node 330 and a connection node 332. The second inverter 320 is coupled to the second supply potential VDDQ as well as to the second reference potential VSSQ, whereas the first inverter 322 is coupled to the first supply potential VDD and the first reference potential VSS. Between the connection node 322 and an output node DX, finally, a third inverter 340 is connected, which is coupled to the second supply potential VDDQ and the second reference potential VSSQ like the second inverter 320. Again, it is assumed here that a circuit coupled to the input node 330 is coupled to the first supply potential VDD and the first reference potential VSS, and that a circuit coupled to the output node DX is coupled to the second supply potential VDDQ and the second reference potential VSSQ. As with the circuit 210 shown on the basis of FIG. 2, a first circuit domain 350 as well as second circuit domain 352, between which a boundary 356 passes, are defined by the respective supply and reference potentials.

Again, there are two mutually complementary signals, namely the signal at the input of the second inverter 320 and the signal at the output of the first inverter 322, which cross the boundary 356. Thus, again two mutually complementary signals with mutually complementary switching edges are exchanged between the first circuit domain 350 and the second circuit domain 352. In the circuit 310 shown, however, only two inverters 320, 322 are used, wherein the one is coupled to the input-side supply and reference potentials and the other to the corresponding output-side potentials. The outputs of these two inverters 320, 322 are combined at a common connection node 332, wherein a further inverter 340 coupled to the second supply potential VDDQ and the second reference potential VSSQ takes over the function of a buffer and makes the signal available at the output node DX. In terms of the principle functioning, particularly with reference to the averaging of the propagation times by the second inverter 320 and by the first inverter 322, the circuit 310 corresponds to the circuit 210 shown on the basis of FIG. 2, so that no further explanations are necessary here.

Figure 4:
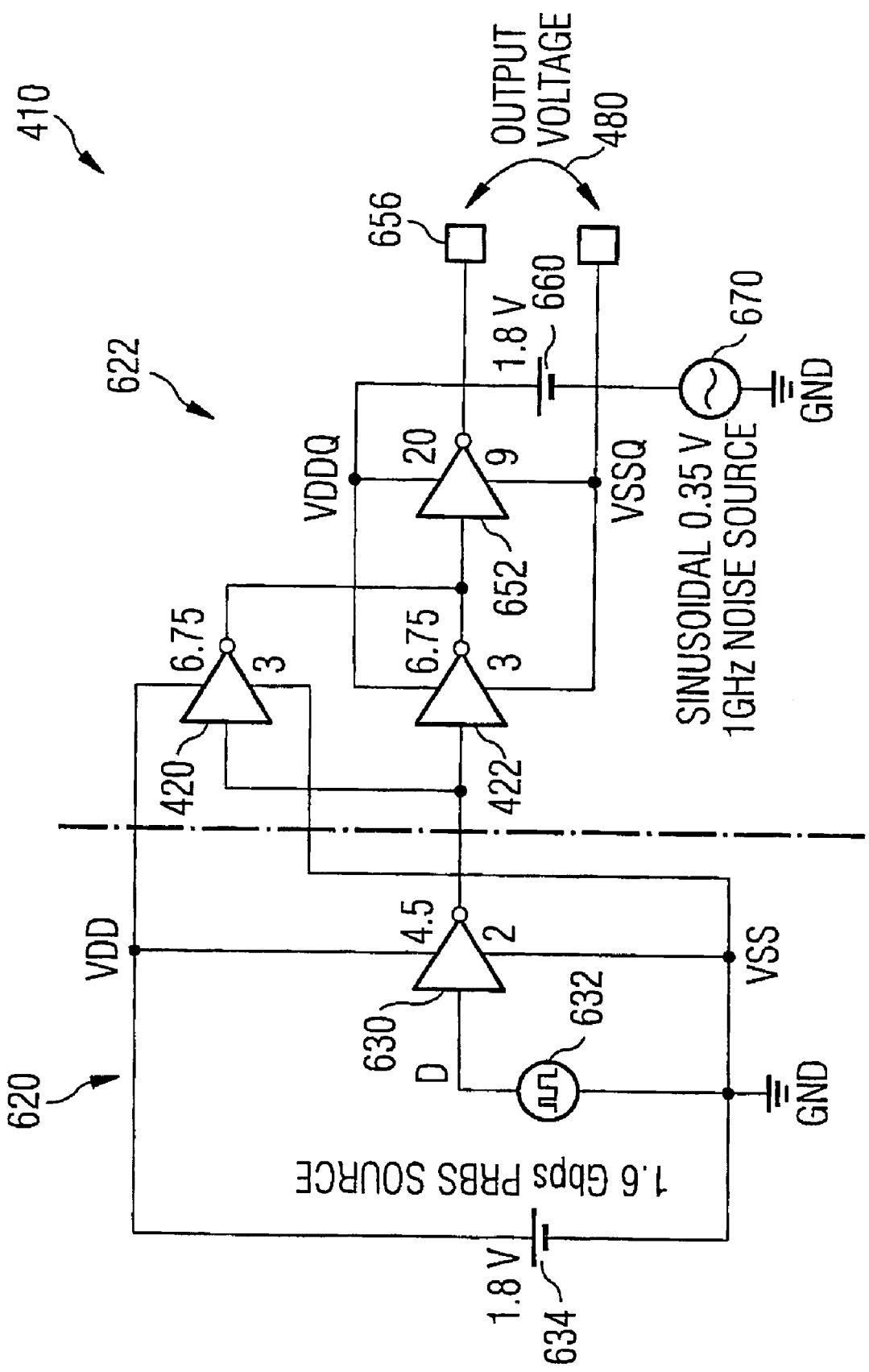
FIG. 4 is a simplified circuit diagram of an output driver with an inventive circuit according to a fourth embodiment of the present invention in connection with an excitation source.

FIG. 4 shows a simplified circuit diagram of an output driver with an inventive circuit according to a fourth embodiment of the present invention in connection with an excitation source. The circuit arrangement in its entirety is designated with 410. It includes an excitation source 620 matching the excitation source of the circuit 610 shown on the basis of FIG. 6 with reference to its construction. It should be pointed out that like reference numerals in FIGS. 4 and 6 designate like means. The circuit further includes a driver circuit 622 constructed similarly to the circuit shown on the basis of FIG. 6. Here, like reference numerals also point to like means or signals. Again, it is assumed that the excitation source 620 is supplied from an energy supply with low statistical fluctuations (low noise power supply), whereas the energy supply for the driver circuit 622 is subject to greater statistical fluctuations (noisy power supply).

Figure 6:
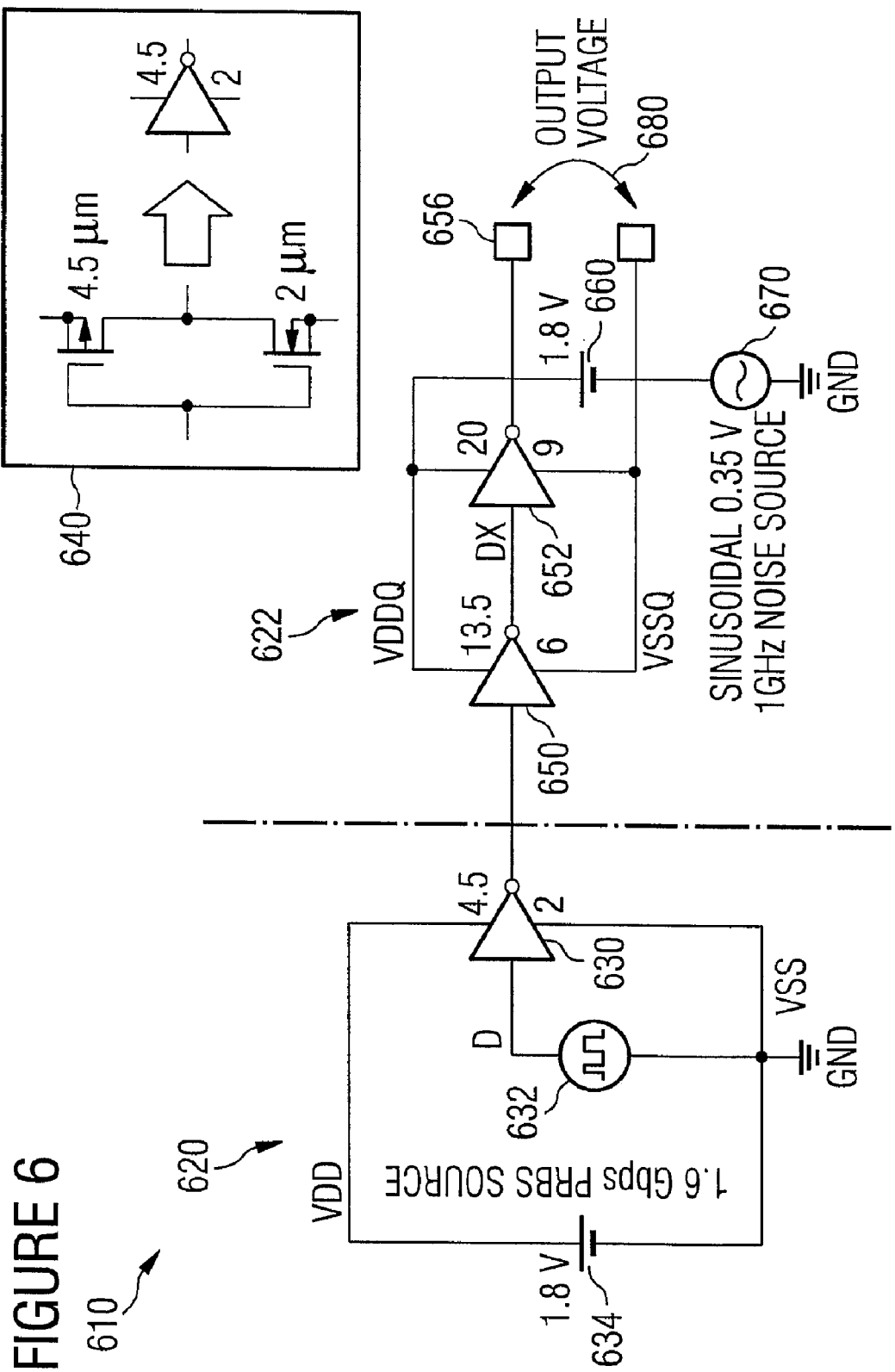
FIG. 6 is a simplified circuit diagram of an output driver of a microelectronic circuit according to the prior art in connection with an excitation source.
Figure 7:
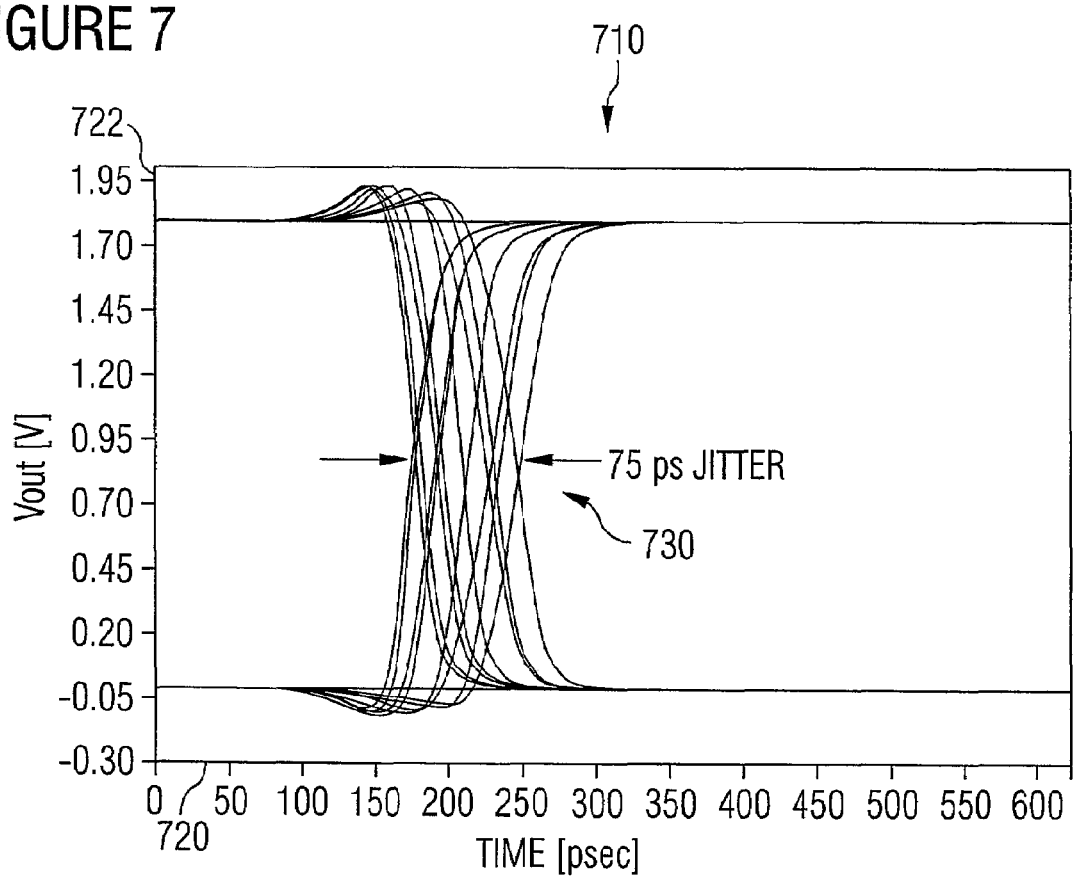
FIG. 7 is an extract from a simulated eye diagram for an output driver according to the prior art.

The substantial difference between the circuit 410 shown on the basis of FIG. 4 and the circuit 610 shown on the basis of FIG. 6 is that in the circuit 410 the second inverter 650 of the circuit 610 is replaced by two inverters 420, 422 connected in parallel. These inverters are referred to as first coupling inverter 420 and second coupling inverter 422. The first and second coupling inverters 420, 422 are connected in parallel between the output of the first inverter 630 and the input of the third inverter 652. The coupling inverters in the example shown both have the same transistor geometry, wherein the n-channel field effect transistor has a channel width of 3 µm and the p-channel field effect transistor a channel width of 6.75 µm. The first coupling inverter 420 is coupled to the first supply potential VDD and the first reference potential VSS, wherein the second coupling inverter 422 is coupled to the second supply potential VDDQ as well as to the second reference potential VSSQ. Besides, it is pointed out that the channel width of the first and second coupling inverters 420, 422 each is half the channel width of the second inverter 650 of a circuit 610. Thus, the coupling inverters 420, 422 are equivalent to the second inverter 650 of the circuit 610 in static operation. It is thus the central idea of the present circuit that one of the inverters in a signal transmission chain according to the prior art (c.f. circuit 610) is split up in two parts. One part is coupled to the first supply potential VDD and the first reference potential VSS for energy supply (VDD supply). The other part is coupled to the second supply potential VDDQ and the second reference potential VSSQ for energy supply (VDDQ supply).

The circuit 410 shown substantially realizes a circuit 310 shown on the basis of FIG. 3, so that the functioning substantially corresponds to the circuit 310 or the circuit 210. The circuit 410 shown is the basis for a simulation with the Agilent Technologies ADS simulation software.

Figure 5:
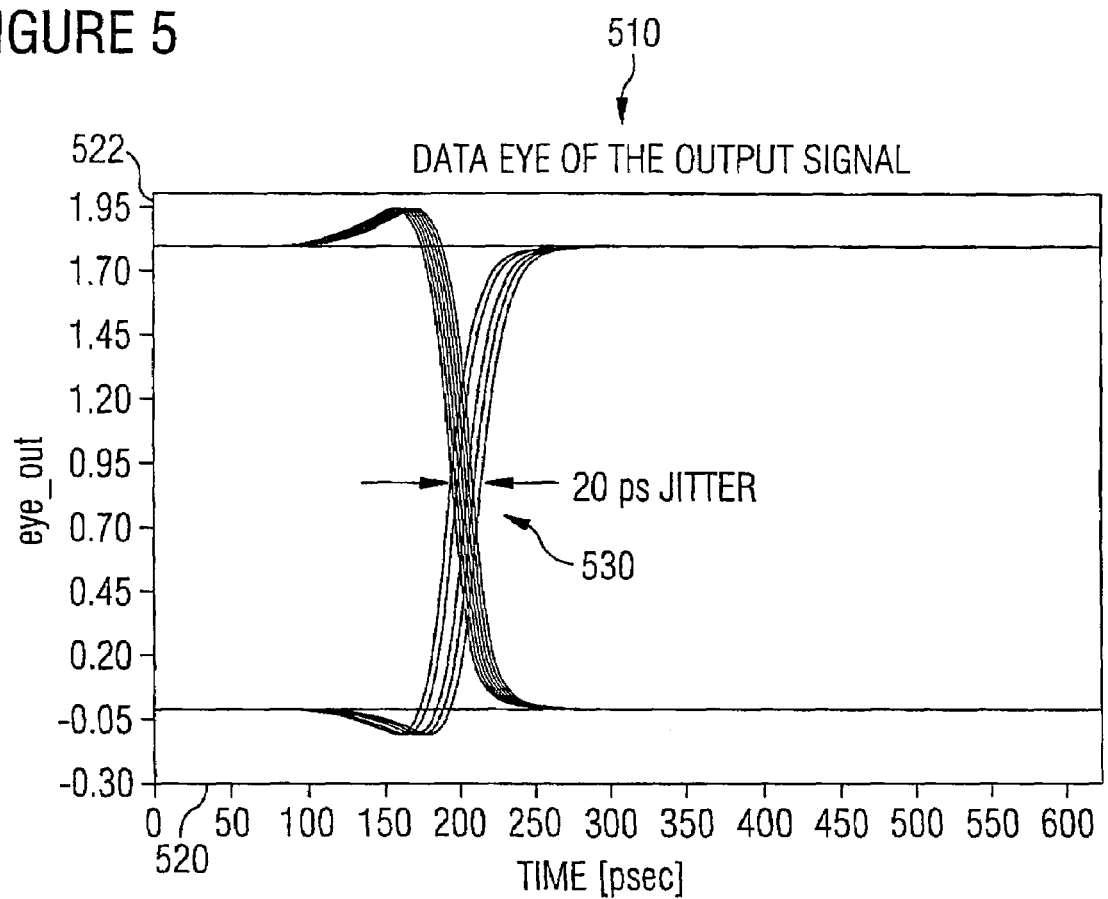
FIG. 5 is an extract from a simulated eye diagram for an output driver according to the fourth embodiment of the present invention.

FIG. 5 shows an extract from a simulated eye diagram for an output driver according to the fourth embodiment of the present invention. The eye diagram in its entirety is designated with 510. On the abscissa 520, the time in ps in a range from 0 to 625 ps is plotted. The ordinate 522 shows the output voltage 480 of a circuit 410. From the eye diagram 510, which substantially shows a transition from a low to a high logic level and vice versa, it can be seen that in a circuit 410 the jitter 530 of the output voltage 480 is about 20 ps at the previously described excitation and the described coupling in of a disturbance on the second reference potential VSSQ. A comparison of the eye diagrams 510 and 710, which were simulated for an inventive circuit 510 as well as a conventional circuit 610, shows that in an inventive circuit the bit-pattern-dependent time shifts at the output decrease to 20 ps, whereas in a conventional circuit the temporal shifts are about 75 ps. The improvement by 55 ps, which may be achieved by use of an inventive circuit, should also be compared with the overall admissible time deviation of 125 ps according to a specification for a current high-speed device. This comparison, in particular, shows how an inventive circuit can improve the time behavior at the output of a circuit arrangement.

An inventive circuit may also be employed in a signal path performing a level decrease between two supply voltages VINT and VDD, wherein VDD>VINT. Here, an inverter supplied with the supply voltage VDD may directly control an inverter supplied with a supply voltage VINT. Since the switching point of the inverter supplied with the voltage VINT is at about VINT/2, wherein VINT/2<VDD/2, a time shift is introduced with the level decrease. This temporal shift may likewise be decreased or suppressed by the combination of two opposite edges.

Furthermore, an inventive circuit is not bound to the use of CMOS inverters as inverters. Rather, every inverting circuit arrangement may be employed as inverter. For example, it is possible to use a NAND gate as inverter. If a NAND gate with two inputs is used as inverter, either both inputs may be connected to the input signal, or one input is set to a high logic level and the other input is connected to the input signal. Similarly, an NOR gate may be used as inverter.

The present invention is thus based on the basic idea to perform averaging between signal edges accelerated and decelerated by potential fluctuations at an output puffer. Thereby, a propagation time difference caused by potential fluctuations for rising and falling edges when passing through an output puffer may be avoided. The statistical potential fluctuations may for example be contingent on parasitic inductances on the supply potential feeds.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A circuit for coupling a logic signal from a circuit input to a circuit output, the circuit comprising:
a parallel connection of a first circuit branch and a second circuit branch, wherein an inverter in the first circuit branch powered as last inverter in this branch via first supply terminals, via which a first supply potential and a first reference potential are supplied, and an inverter in the second circuit branch powered as first inverter in this circuit branch via second supply voltage terminals, via which a second supply potential and a second reference potential are supplied, receive the same logic value of the logic signal,
wherein outputs of the two circuit branches are connected to each other and coupled to the circuit output,
wherein the circuit is arranged on a chip, the chip having on-chip potential rails for guiding the first supply potential and the first reference potential,
wherein there also are potential feeds for providing the second supply potential and the second reference potential on the chip,
wherein the on-chip potential rails are separated from the potential feeds for providing the second supply potential and the second reference potential,
wherein the first circuit branch consists of a series connection of n transmission stages configured to transmit a signal from the input of the first circuit branch to the output of the first circuit branch,
wherein n>1;
wherein the first m transmission stages, counted from the input of the first circuit branch, are coupled to the first supply potential and the first reference potential;
wherein the last (n-m) transmission stages are coupled to the second supply potential and the second reference potential;
wherein 0<m<n;
wherein the second circuit branch consists of a series connection of q transmission stages configured to transmit a signal from an input of the second circuit branch to an output of the second circuit branch,
wherein q>1;
wherein the first p transmission stages, counted from the input of the second circuit branch, are coupled to the first supply potential and the first reference potential;
wherein the last (q-p) transmission stages are coupled to the second supply potential and the second reference potential; and
wherein 0<p<q.

2. The circuit of claim 1, wherein n=q.

3. The circuit of claim 2, wherein |p-m|=1.

4. The circuit of claim 1, wherein a transmission stage includes an inverter or a non-inverting driver.

5. The circuit of claim 1, wherein the circuit is configured to receive an input signal at the circuit input from a first circuit arrangement connected to the first supply potential and the first reference potential for the purpose of energization, and to provide an output signal at the circuit output for a second circuit arrangement coupled to the second supply potential and the second reference potential for the purpose of energization.

6. The circuit of claim 1, wherein the circuit is configured to receive an input signal at the circuit input from an integrated circuit arrangement coupled to the first reference potential and the first supply potential for the purpose of energization, wherein the circuit and the integrated circuit arrangement are monolithically integrated on a chip.

7. The circuit of claim 1, wherein the outputs of the two circuit branches are connected to each other and coupled to the circuit output via an output driver.

8. The circuit of claim 7, wherein the output driver is coupled to the second supply potential and the second reference potential.

9. The circuit of claim 1, wherein a signal based on an input signal present on the circuit input is supplied to inputs of the first circuit branch and of the second circuit branch.

10. The circuit of claim 9, wherein the signal based on the input signal is the input signal itself.

11. The circuit of claim 1, wherein signals with the same logic value are present in a stationary operation state at the outputs of the first circuit branch and of the second circuit branch.

12. The circuit of claim 1, wherein a number of inverters in the first circuit branch is equal to a number of inverters in the second circuit branch.

13. The circuit of claim 1, wherein the inverters are CMOS inverters.

14. The circuit of claim 1, wherein a potential difference between the first supply potential and the first reference potential is equal to a potential difference between the second supply potential and the second reference potential.

15. The circuit of claim 1, wherein the first reference potential is equal to the second reference potential in a static case.

16. The circuit of claim 1, wherein the first circuit branch includes a first inverter coupled to the first supply potential and the first reference potential and the input of which is coupled to the circuit input; and
wherein the second circuit branch includes a second inverter coupled to the second supply potential and the second reference potential,
wherein the outputs of the first inverter and of the second inverter are connected to each other and coupled to the circuit output.

17. The circuit of claim 16, wherein the outputs of the first inverter and of the second inverter are connected to each other and coupled to the circuit output via at least an inverter or a non-inverting driver.

18. The circuit of claim 1, wherein the first circuit branch includes a first and a second series-connected inverter, and wherein the second circuit branch includes a third and a fourth series-connected inverter, wherein an input of the first inverter and an input of the third inverter are connected to the circuit input, wherein an output of the second inverter and an output of the fourth inverter are connected to each other and coupled to the circuit output, wherein the first inverter is coupled to the first supply potential and the first reference potential, and wherein the second, third, and fourth inverters are coupled to the second supply potential and the second reference potential.

19. A method for transmitting an input signal from a first circuit domain of a circuit coupled to a first supply potential and a first reference potential to a second circuit domain of the circuit coupled to a second supply potential and a second reference potential, wherein the circuit is arranged on a chip, the chip having on-chip potential rails for guiding the first supply potential and the first reference potential, wherein there also are potential feeds for providing the second supply potential and the second reference potential on the chip, and wherein the on-chip potential rails are separated from the potential feeds for providing the second supply potential and the second reference potential, comprising the steps of:

splitting up the input signal into a first signal passed on via a first circuit branch and a second signal passed on via a second circuit branch;

handing over a signal dependent on the input signal from the first circuit domain to the second circuit domain in the first circuit branch;

handing over a signal dependent on the input signal from the first circuit domain to the second circuit domain in the second circuit branch, wherein the signal handed over from the first circuit domain to the second circuit domain in the second circuit branch has a logic level complementary to a logic level of the signal handed over from the first circuit domain to the second circuit domain in the first circuit branch; and recombining the signals passed on via the two circuit branches, in order to obtain an output signal, wherein a temporal location of level transitions on the output signal is determined by averaging temporal locations of accompanying level transitions on the signals passed on via the two circuit branches.

* * * * *

UNITED STATES PATENT AND TRADEMARK OFFICE
CERTIFICATE OF CORRECTION

PATENT NO. : 7,411,439 B2
APPLICATION NO. : 11/260506
DATED : August 12, 2008
INVENTOR(S) : Brox et al.

It is certified that error appears in the above-identified patent and that said Letters Patent is hereby corrected as shown below:

In Col. 11, line 31, delete "cuffent" and insert --current--.
In Col. 15, line 40, delete "n>1" and insert --n≥1--.
In Col. 15, line 47, delete "0<m<n" and insert --0≤m≤n--.
In Col. 15, line 52, delete "q>1" and insert --q≥1--.
In Col. 15, line 59, delete "0<p<q" and insert --0≤p≤q--.

Signed and Sealed this

Twenty-fifth Day of November, 2008

JON W. DUDAS
*Director of the United States Patent and Trademark Office*